United States Patent
Bryant et al.

(10) Patent No.: US 9,525,069 B2
(45) Date of Patent: Dec. 20, 2016

(54) STRUCTURE AND METHOD TO FORM A FINFET DEVICE

(71) Applicant: GLOBALFOUNDRIES INC., Grand Cayman (KY)

(72) Inventors: Andres Bryant, Burlington, VT (US); Jeffrey B. Johnson, Essex Junction, VT (US); Effendi Leobandung, Stormville, NY (US); Tenko Yamashita, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/576,611

(22) Filed: Dec. 19, 2014

(65) Prior Publication Data

US 2015/0303272 A1     Oct. 22, 2015

Related U.S. Application Data

(60) Provisional application No. 61/982,079, filed on Apr. 21, 2014.

(51) Int. Cl.
| | |
|---|---|
| H01L 21/336 | (2006.01) |
| H01L 29/78 | (2006.01) |
| H01L 29/66 | (2006.01) |

(52) U.S. Cl.
CPC ....... *H01L 29/785* (2013.01); *H01L 29/66545* (2013.01); *H01L 29/66795* (2013.01)

(58) Field of Classification Search
CPC ................ H01L 21/823431; H01L 21/823821; H01L 21/845
USPC ......................................................... 438/197
See application file for complete search history.

(56) References Cited

U.S. PATENT DOCUMENTS

| | | | |
|---|---|---|---|
| 7,635,632 B2 | 12/2009 | Yeo et al. | |
| 7,960,791 B2 | 6/2011 | Anderson et al. | |
| 8,169,027 B2 | 5/2012 | Doyle et al. | |
| 8,207,038 B2 | 6/2012 | Cheng et al. | |
| 2010/0133614 A1 | 6/2010 | Beyer et al. | |
| 2011/0049583 A1 | 3/2011 | Lin et al. | |
| 2012/0043610 A1 | 2/2012 | Cheng et al. | |
| 2012/0193712 A1 | 8/2012 | Bryant et al. | |
| 2014/0167162 A1 | 6/2014 | He et al. | |
| 2014/0170825 A1 | 6/2014 | He et al. | |
| 2015/0140762 A1 | 5/2015 | He et al. | |

(Continued)

OTHER PUBLICATIONS

List of IBM Patents or Patent Applications Treated as Related; Dec. 19, 2014, pp. 1-2.

(Continued)

*Primary Examiner* — Elias M Ullah
(74) *Attorney, Agent, or Firm* — Thompson Hine LLP

(57) ABSTRACT

A method for fabricating a FinFET device includes forming a silicon-on-insulator (SOI) substrate having a semiconductor layer overlaying a buried oxide (BOX) layer; etching the semiconductor layer to form a plurality of fin structures and a semiconductor layer gap in between the plurality of fin structures and the BOX layer; depositing a sacrificial gate over at least one gate region, wherein the gate region separates a source and a drain region; disposing offset spacers on vertical sidewalls of the sacrificial gate; removing the sacrificial gate; removing the semiconductor layer gap in the gate region to prevent merging of the plurality of fin structures in the gate regions; and fabricating a high-k dielectric metal gate structure overlaying the fin structures in the gate region.

11 Claims, 9 Drawing Sheets

(56) References Cited

U.S. PATENT DOCUMENTS

2015/0144886 A1    5/2015  He et al.

OTHER PUBLICATIONS

M. Guillorn, et al., "FinFET Performance Advantage at 22nm: An AC Perspective," IEEE Symposium on VLSI Technology Digest of Technical Papers, Jun. 2008, pp. 1-2.

V. S. Basker et al., "A 0.063 µm2 FinFET SRAM cell demonstration with conventional lithography using a novel integration scheme with aggressively scaled fin and gate pitch," 2010 Symposium on VLSI Technology (VLSIT), Jun. 15-17, 2010, pp. 19-20.

List of IBM Patents or Patent Applications Treated as Related; Date Filed: Dec. 19, 2014, pp. 1-2.

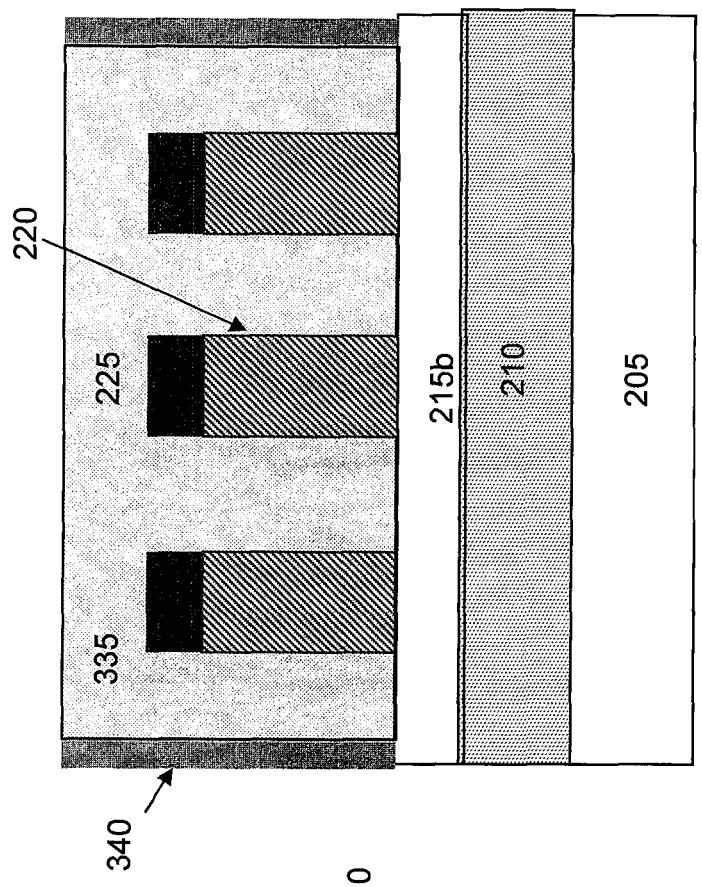
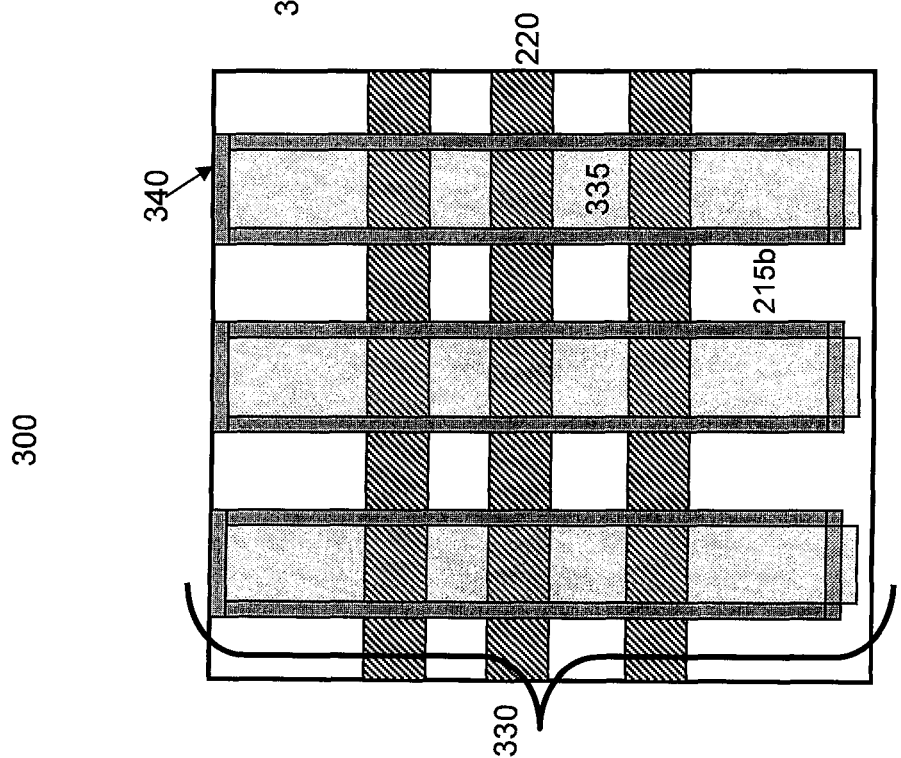

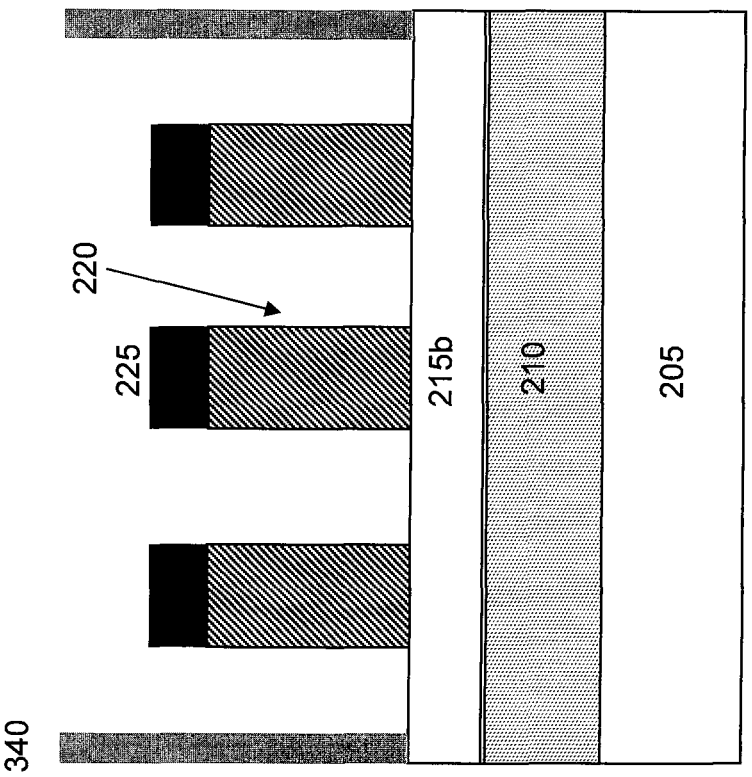
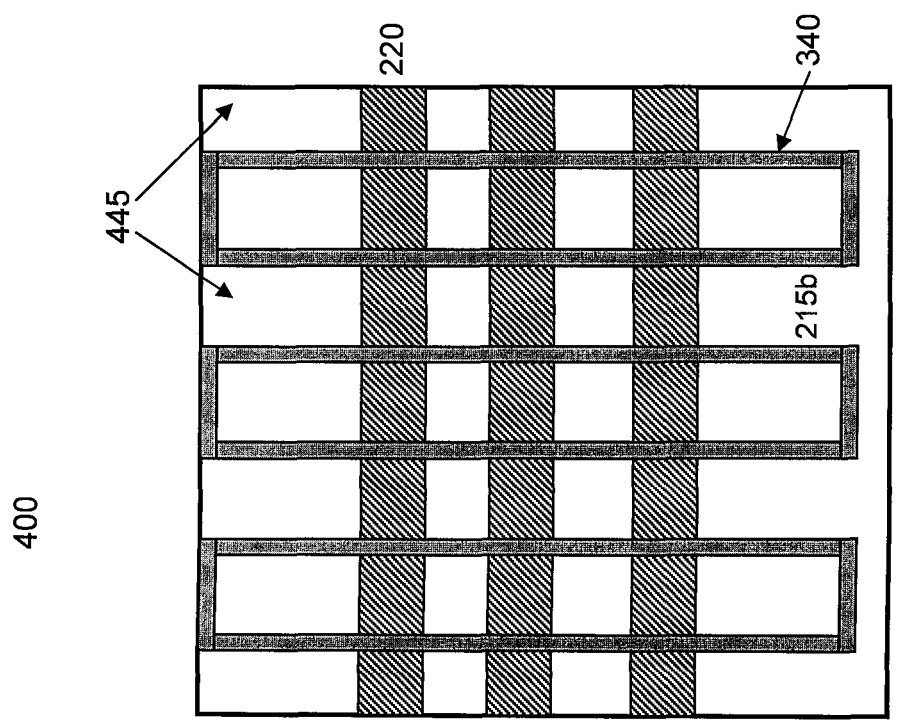
FIG. 4b
FIG. 4a

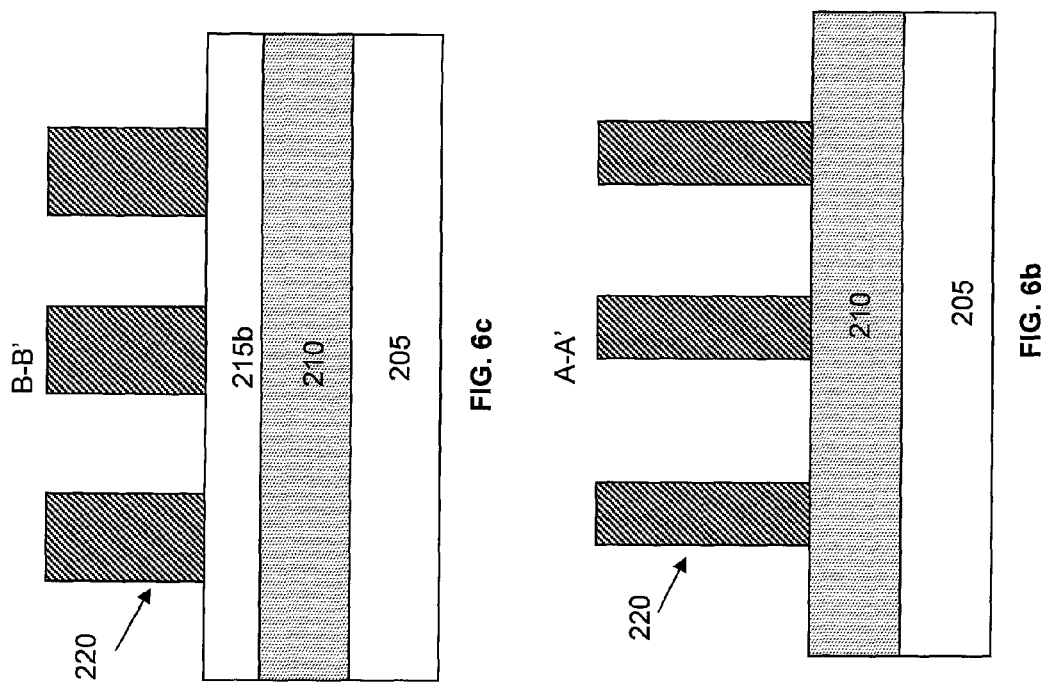
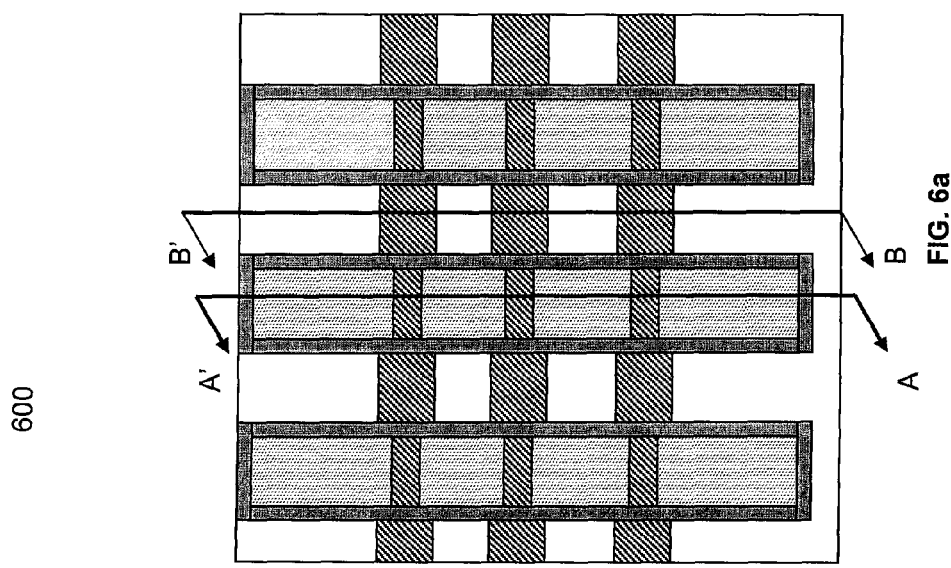
FIG. 6a
FIG. 6b
FIG. 6c

STRUCTURE AND METHOD TO FORM A FINFET DEVICE

DOMESTIC PRIORITY

This application claims priority to U.S. Provisional Application No. 61/982,079, entitled "STRUCTURE AND METHOD TO FORM A FINFET DEVICE," filed Apr. 21, 2014, which is incorporated herein by reference in its entirety.

BACKGROUND

The present invention is related to a fin-shaped field-effect transistor (FinFET), more particularly a method for fabricating a FinFET for improving contact resistance.

A FET is a transistor having a source, a gate, and a drain. A FET employing a fin-shaped channel structure can be referred to as a FinFET. Fin field-effect transistors (FinFET) are multi-gate transistors where the conducting channel is wrapped around a thin piece of silicon, often referred to and configured as a "fin." The dimensions of the fin structure determine the effective channel width of the transistor. Typically, the source, drain, and gate are formed by an extension above the substrate, and the FinFET is viewed as a MOSFET device with a folded gate feature. FinFETs provide a promising candidate for small line width technology because of their short channel effect control, scalability, and higher current drive per unit width.

FinFET is an attractive device structure in terms of short channel effect control. Generally, in a FinFET an epitaxial silicon (epi) layer is deposited over the fin structures to merge the fin structures together. The epi causes yield problems due to the epi defects. The contact resistance of the FinFET is increased because of the epi. Therefore, FinFET parasitics remain a concern and therefore there is a need to improve series resistance.

There is a need for a FinFET device that does not use epitaxy to merge the fins so that there can be improved contact resistance.

SUMMARY

One aspect of the present invention provides a method for fabricating a FinFET device, the method includes: forming a silicon-on-insulator (SOI) substrate having a semiconductor layer overlaying a buried oxide (BOX) layer; etching the semiconductor layer to form a plurality of fin structures and a semiconductor layer gap in between the plurality of fin structures and the BOX layer; depositing a sacrificial gate over at least one gate region, wherein the gate region separates a source and a drain region; disposing offset spacers on vertical sidewalls of the sacrificial gate; removing the sacrificial gate; removing the semiconductor layer gap in the gate region to prevent merging of the plurality of fin structures in the gate regions; and fabricating a high-k dielectric metal gate structure overlaying the plurality of fin structures in the gate region.

Another aspect of the present invention provides a FinFET device which includes: a silicon-on-insulator (SOI) substrate having a semiconductor layer overlaying a buried oxide (BOX) layer; a semiconductor layer having portions to form a plurality of fin structures such that a semiconductor layer gap is present between the BOX layer and the plurality of the fin structures in a source region and a drain region; a high-k dielectric metal gate structure overlaying a portion of the plurality of the fin structures for forming a gate region; the source region and the drain region are on either side of the gate region.

Another aspect of the present invention provides an intermediate FinFET structure which includes: a silicon-on-insulator (SOI) substrate having a semiconductor layer overlaying a buried oxide (BOX) layer; a semiconductor layer having portions to form a plurality of fin structures such that a semiconductor layer gap is present between the BOX layer and the plurality of the fin structures in a source region and a drain region; a high-k dielectric metal gate structure overlaying a portion of the plurality of the fin structures for forming a gate region; and an offset spacer on a vertical sidewall of the sacrificial gate; the source region and the drain region are on either side of the gate region.

BRIEF DESCRIPTION OF THE DRAWINGS

The accompanying figures where like reference numerals refer to identical or functionally similar elements throughout the separate views, and which together with the detailed description are incorporated in and from part of the specification, serve to further illustrate various embodiments to explain various principles and advantages all in accordance with the present invention.

FIG. 3*a* shows the FinFET device after the fabrication of the top view of the sacrificial gate according to a further embodiment of the present invention.

FIG. 3*b* shows a cross-sectional view of the FinFET device after the fabrication of the sacrificial gate according to a further embodiment of the present invention.

FIG. 4*a* shows a top view of the FinFET device after the removal of the sacrificial gate according to a further embodiment of the present invention.

FIG. 4*b* shows a cross-sectional view of the FinFET device after the removal of the sacrificial gate according to a further embodiment of the present invention.

FIG. 6*a* shows the FinFET device after the removal of the hardmask layer and the fabrication of the gate stack from top view according to a further embodiment of the present invention.

FIG. 6*b* shows the FinFET device after the removal of the hardmask layer and the fabrication of the gate stack from a cross sectional view A-A' according to a further embodiment of the present invention.

FIG. 6*c* shows the FinFET device after the removal of the hardmask layer and fabrication of the gate stack from the cross sectional view B-B' according to a further embodiment of the present invention.

DETAILED DESCRIPTION

It is understood that Field Effect Transistors (FET) are well known in the electronic arts. Standard components of an FET are the source, the drain, the body in-between the source and the drain and the gate. The gate is overlaying the body and is capable to induce a conducting channel in the body between the source and the drain. In the usual nomenclature, the channel is hosted by the body. The gate is typically separated from the body by the gate insulator, or gate dielectric. Depending on whether the "on state" current in the channel is carried by electrons or by holes, the FET comes in two types: as NFET or PFET. (In different nomenclature the NFET and PFET devices are often referred to as MOS and PMOS devices.)

The present invention describes a method for fabricating a FinFET device and an apparatus for a FinFET device for improving contact resistance by increase the contact area of the FinFET.

Figure 1:
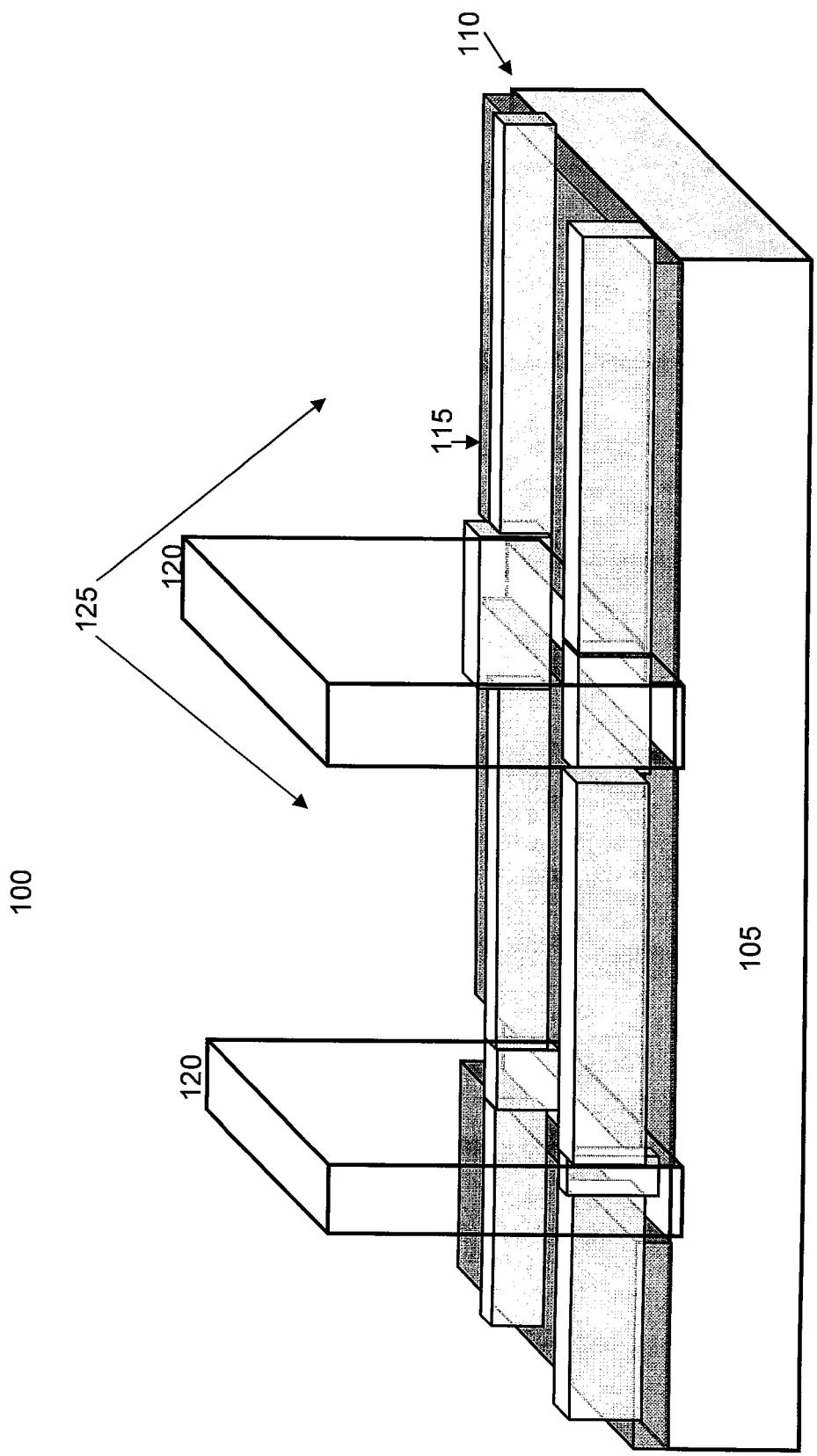
FIG. 1 shows a FinFET device according to an embodiment of the present invention.

FIG. 1 shows a FinFET device according to an embodiment of the present invention. Referring to FIG. 1, a plurality of fin structures are formed over a principal surface. The principle surface is a silicon-on-insulator (SOI) substrate. According to an embodiment of the present invention, the material of the semiconductor substrate is silicon (not shown). Overlaying the silicon substrate is a buried-oxide layer (BOX) layer 105. Atop the BOX layer is a semiconductor layer. According to an embodiment of the present invention, the semiconductor layer material is silicon (Si). Referring to FIG. 1, the silicon layer 110 overlays the BOX layer 105.

Referring to FIG. 1, there are at least two fin structures 115. According to the present invention, the fin structures are formed by etching the semiconductor layer so that they create at least one channel that depicts a fin. According to embodiments of the present invention, the semiconductor layer 110 can be Si based material, which can be essentially pure silicon (Si), but can also be silicon-germanium (SiGe) alloy, or Si with carbon Si:C. It is preferred that the fin structure material is Silicon (Si). Referring to FIG. 1, there is at least one gate region 120 that overlays perpendicular to the fin structures and separates the source and drain region 125.

Figure 2:
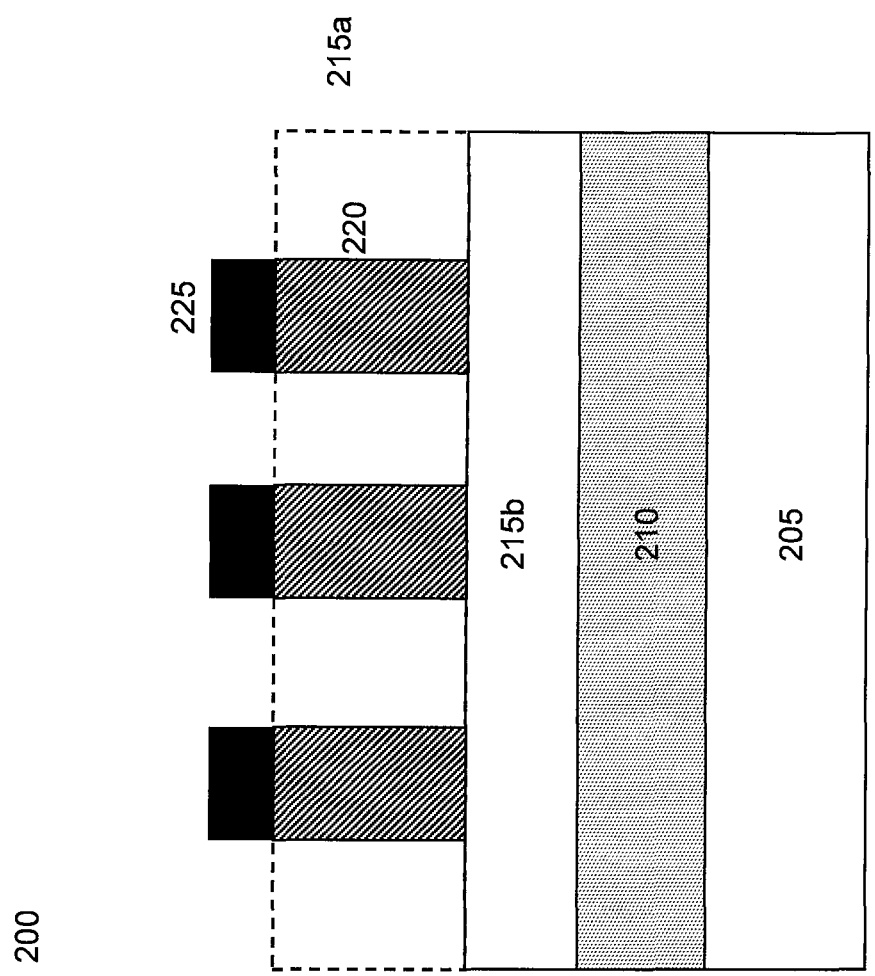
FIG. 2 shows a plurality of fin structures of the FinFET device according to a further embodiment of the present invention.

FIG. 2 shows the fin structures of the FinFET device according to an embodiment of the present invention. According to an embodiment of the present invention, a silicon-on-insulator (SOI) substrate is formed. The SOI substrate includes a silicon layer 205, a BOX layer 210, and overlaying the box layer is a semiconductor layer 215a (in the dashed line). The semiconductor layer material is Silicon (Si). Overlaying the semiconductor layer is the hardmask layer 225. According to an embodiment of the present invention, the hardmask layer can be silicon dioxide (SiO2) or silicon nitride (SiN). The hardmask layer can be deposited on top of the semiconductor layer using conventional methods. For example, the deposition of the material can be accomplished on the basis of well-established deposition techniques, such as plasma enhanced chemical vapor deposition (CVD), thermally activated CVD, spin-on techniques, depending on the material characteristics required.

Referring to FIG. 2, the semiconductor layer is etched to form a plurality fin structures 220 so that there is a semiconductor material layer gap 215b in between the fin structures and the BOX layer. To form the fin structures conventional techniques of masking and etching can be used as known in the relevant art. For example, the etching of the plurality of fin structure can use a reactive ion etching (REI) process and/or any other suitable process.

According to embodiments of the present invention, the height of the fin structures 220 can range from 10 nm to about 80 nm and ranges there between, but is preferably about 35 nm. The width of the fin structures can range from about 5 nm to about 50 nm and ranges there between, but is preferable to range from 10 to about 12 nm. The pitch of the fins can range from about 30 nm to about 150 nm and ranges there between, but is preferably about 40 nm.

Referring to FIG. 2, the fin structures are etched so that there is a still some of the semiconductor layer remaining in between the BOX layer and the fin structures which is the semiconductor layer gap 215b. The semiconductor layer gap 215b merges the fin structures and allows for electrical communication between the fin structures. According to an embodiment of the present invention, the preferred thickness of the semiconductor layer gap is 10 nm.

FIG. 3 shows the fabrication of the sacrificial gate according to a further embodiment of the present invention. The sacrificial gate 335 is deposited before implanting the ions in the source and drain regions (not shown in FIG. 3). According to an embodiment of the present invention, a polycrystalline silicon (polysilicon) structure 335 is deposited over the hardmask layer 225 and acts as the sacrificial gate. According to the present invention, offset spacers 340 are disposed on the vertical sidewalls of the polysilicon gate. The offset spacers can be silicon nitride SiN. The polysilicon gate is etched to cover the gate region of the FinFET device. FIG. 3a shows the top view of the fabricated sacrificial gate and shows the polysilicon structure 335 and the offset spacers 340 which are disposed on the sidewalls of the sacrificial gate and border the gate region 330. FIG. 3b shows a cross-sectional view from the gate region of the FinFET device with the polysilicon gate 335 overlaying the hardmask layer 225 and the offset spacers 340 that are disposed on the vertical sidewalls of the sacrificial gate and border the gate region.

FIG. 4 shows the FinFET device after the removal of the sacrificial gate according to an embodiment of the present invention. The S/D regions 445 are located on either end of the gate region FIG. 4a. In a discrete device as is being described, the source and drain are described together as they are interchangeable. Referring to FIGS. 4a and 4b, the offset spacers 340 are not removed when the sacrificial gate is removed so that the offset spacers remain bordering the gate area. The sacrificial gate is removed after the ion implantation in the source and drain regions of the FinFET. The standard ion beam implantation method is used to form either an n-type for NMOS or a p-type for PMOS FinFET. FIG. 4a shows the top view of the FinFET device after the removal of the sacrificial gate. FIG. 4b shows the cross-sectional view from the gate region of the FinFET device after the removal of the sacrificial gate.

Figure 5B:
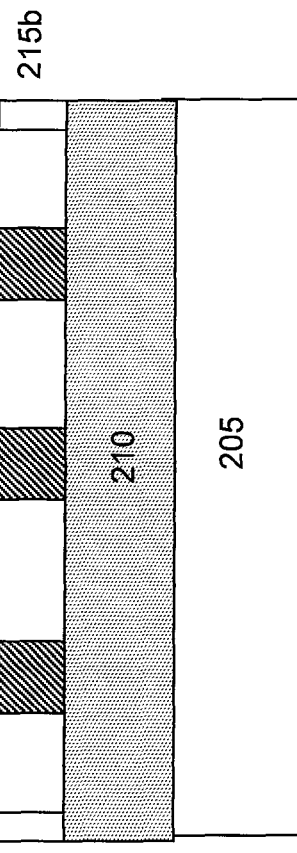
FIG. 5*b* shows the cross-sectional view of the FinFET device after the semiconductor layer gap is removed from the gate region according to a further embodiment of the present invention.
Figure 5A:
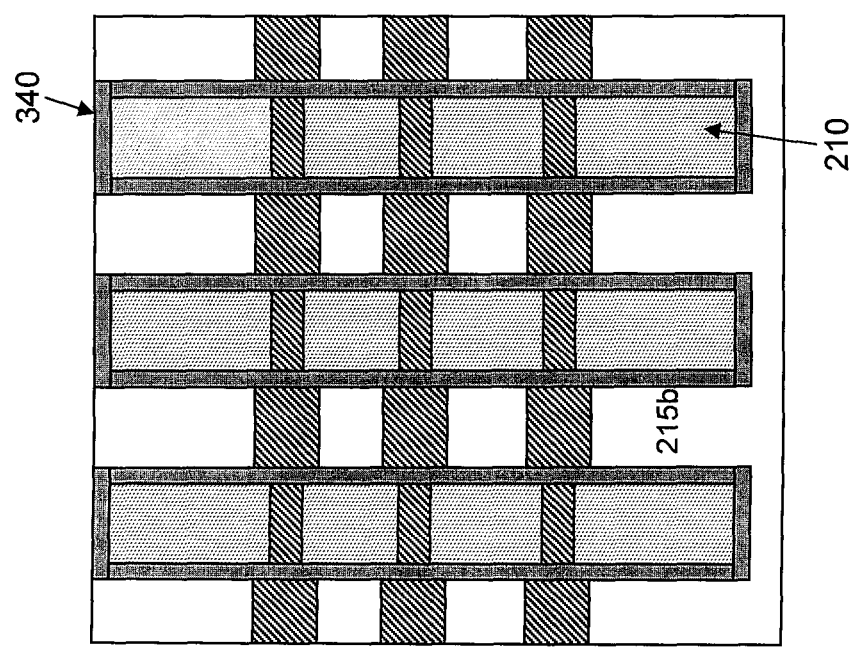
FIG. 5*a* shows a top view of the FinFET device after the semiconductor layer gap is removed from the gate region according to a further embodiment of the present invention.

FIG. 5 shows the FinFET device after the semiconductor layer gap is etched from the gate region according to an embodiment of the present invention. Referring to FIG. 5a, which depicts a top view of the FinFET device, the fin structures 225 are etched further in the gate region so that the width of the fin structures in the gate region is less than the width of the fin structures in the source and drain regions. Preferably, the fin structures in the gate region are reduced so that the horizontal width of the fin structures ranges from about 1 nm to about 3 nm and ranges there between. Also the semiconductor layer gap is etched and removed from the gate region as to prevent merging of the fin structures in the gate region.

According to an embodiment of the present invention the fin structures are reduced. The fin structures are reduced so that the horizontal width of the fin structures in the gate region is less than the horizontal width of the fin structures in the source and drain regions. Preferably the fin structures are reduced by a range from 1 nm to about 3 nm and. FIG. 5b shows the cross sectional view from the gate region. As shown in FIG. 5b the gate region has no semiconductor layer gap in between the fin structures and the width of the fin structures in the gate region are reduced so that they are less than the width of the fin structures in the source and drain regions.

FIG. 6 shows the FinFET device after the removal of the hardmask layer according to an embodiment the present invention. FIG. 6a shows the top view of the FinFET device after the removal of the hardmask layer. FIG. 6b shows the cross sectional view A-A' (from the gate region) of the FinFET device after the removal of the hardmask layer. FIG. 6b shows the cross sectional view B-B' (from the S/D region) after the removal of the hardmask layer.

Figure 7:
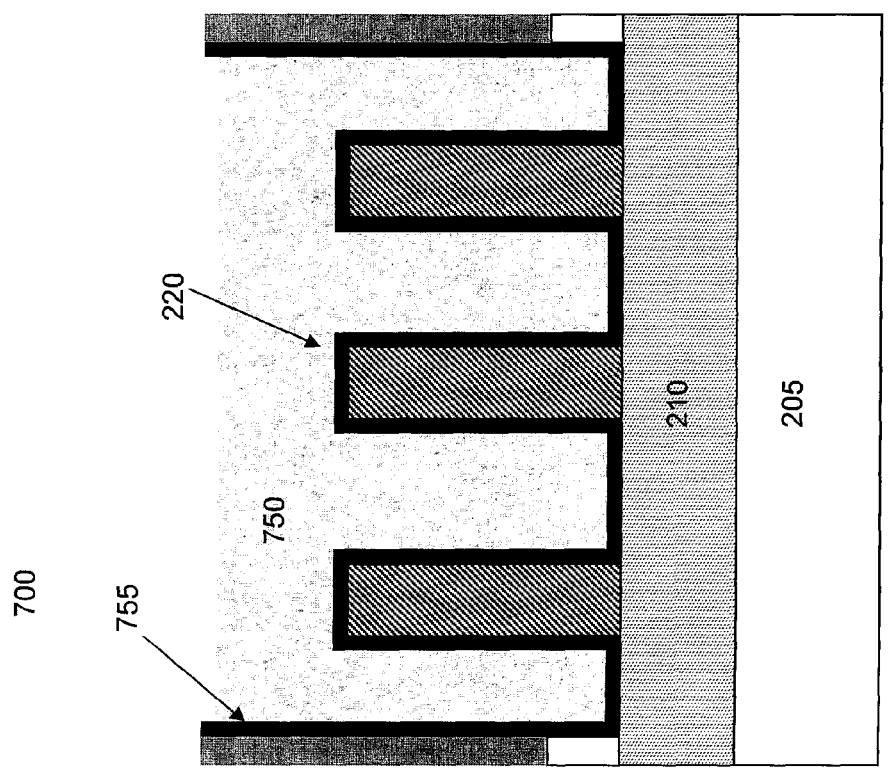
FIG. 7 shows the FinFET device after with the high-k dielectric spacers according to a further embodiment of the present invention.

FIG. 7 shows the fabrication of the high-k metal gate structure and the high-k dielectric spacers according to an embodiment of the present invention. Referring to FIG. 7, the high-k metal gate structure 750 is located over the fin structures in the gate region. A gate stack is formed perpendicular to the fin structures and overlays the fin structures. As shown in FIG. 7, the gate structure includes a high-k metal gate and a high-k dielectric layer. Referring to FIG. 7, the high-k dielectric spacers are formed on the vertical sidewalls of the gate structure and the fin structures in the gate region.

According to the present invention the high-k metal gate structure can vary depending on the FinFET device. For example, such as titanium nitride, with high-k gate dielectrics, such as hafnium dioxide (HfO2), zirconium dioxide (ZrO2), or titanium dioxide (TiO2), can be used. The high-k dielectric material can be deposited by any suitable process, including, but not be limited to, atomic layer deposition (ALD), molecular layer deposition (MLD), chemical vapor deposition (CVD), plasma enhanced chemical vapor deposition (ECVD), high density plasma vapor deposition (RTCVD), in situ radical assisted deposition, ultrahigh vacuum chemical vapor deposition (UH-VCVD), metalorganic chemical vapor deposition (MO CVD), molecular beam epitaxy (MBE), physical vapor deposition, sputtering, evaporation ion beam deposition, electron beam deposition, laser assisted deposition, chemical solution deposition, or any combination of those methods. Preferably, the deposition method is ALD. The high-k thickness can range from about 0.5 to about 3 nm, but is preferable to range from 10 angstroms to about 20 angstroms. The thickness of the metal gate can range from 10 nm to 100 nm.

According to a further embodiment of the present invention, the patterning of the high-k metal gate can be performed using reactive ion etching (RIE) process.

According to a further embodiment of the present invention, after the high-k metal gate structure has been formed subsequent operations can be used to form a conductive material within and filling opening. According to one exemplary embodiment, the conductive material can be aluminum, but other conductive materials can be used in other exemplary embodiments. For example, the conductive material can be formed using at least one chemical vapor deposition operation and at least one physical vapor deposition operation, but in other exemplary embodiments, only one of the aforementioned operations can be used and in other exemplary embodiments, still other deposition operations can be used. According to further embodiments of the present invention, conventional processing can then be utilized to carry out further processing steps which can include a CMP, chemical mechanical planarization, or other planarization process to form a metal gate that includes the conductive material and diffusion barrier layer filling former opening which was previously occupied by a sacrificial gate material. Further processing operations can then be carried out to effectuate the manufacture of suitable semiconductor devices.

Figure 8:
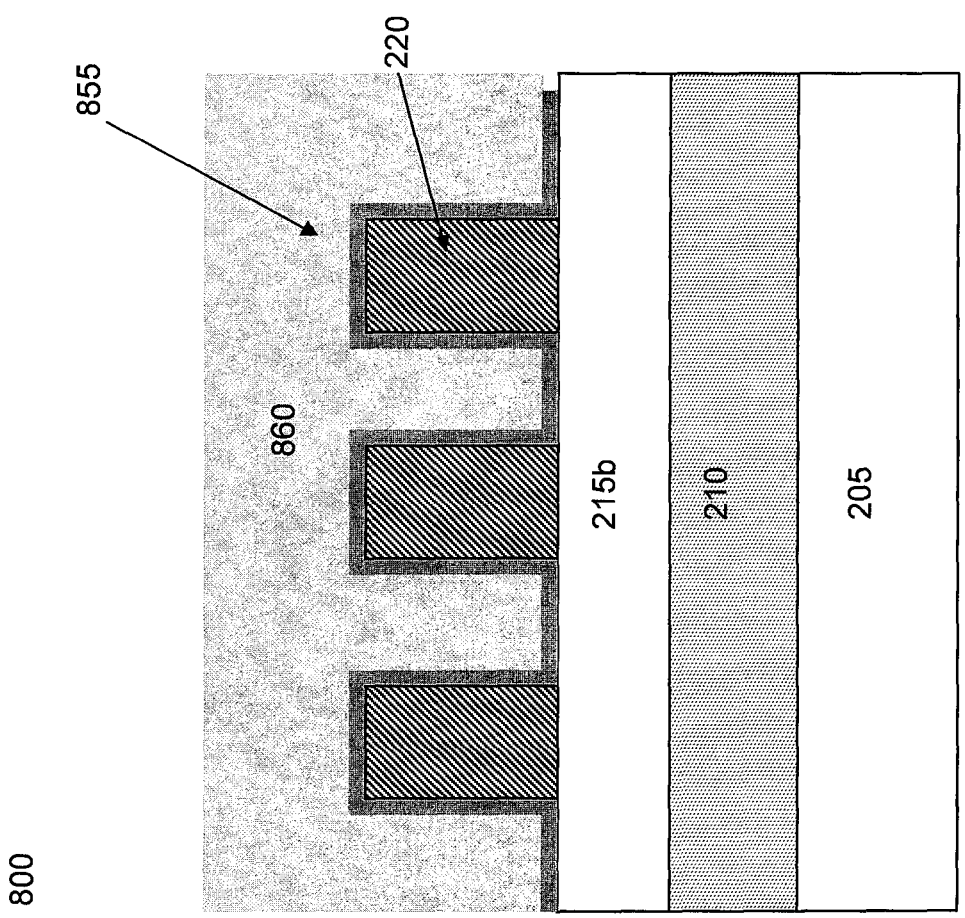
FIG. 8 shows the FinFET device after with the metal silicide layers in the source and drain regions according to a further embodiment of the present invention.

FIG. 8 shows the process to form metal silicide layers in the source and drain regions according to an embodiment of the present invention. The silicidation process is performed to form metal silicide layers over the fin structures in the source and drain regions 440. The process includes depositing a metal material 855 over the semiconductor layer and the fin structures in the source and drain regions. The next step is depositing a metallic contact material 860 over the metal material. Then exposing the substrate to a diffusionless annealing process to form a metal silicide material. In the illustrated embodiment, a nickel silicide is formed. In further embodiments of the present invention, the silicide is formed using nickel, titanium, cobalt, or a combination or alloy thereof. According to an embodiment of the present invention, the metal material is tungsten.

According to a further embodiment of the present invention, the offset spacers are removed after the metal silicide layers are formed in the source and drain regions.

Figure 9:
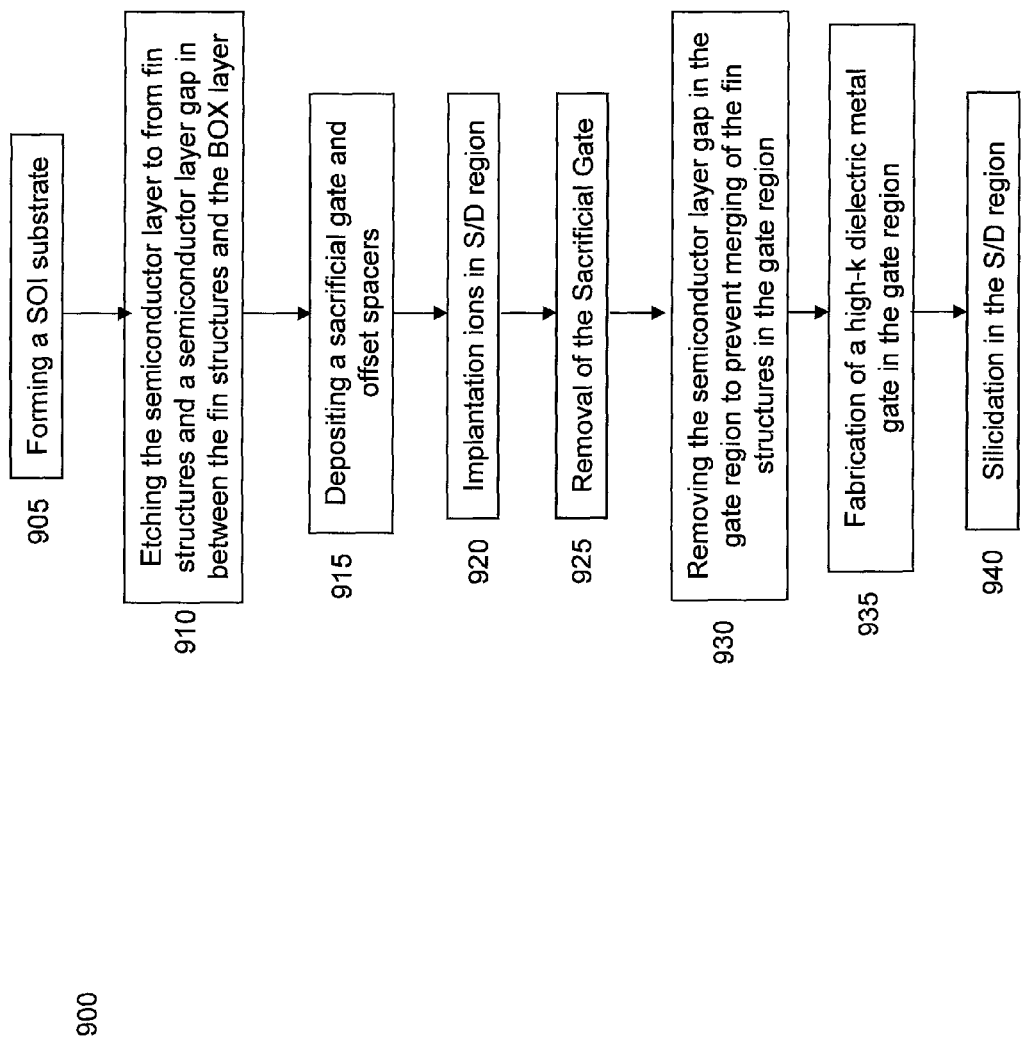
FIG. 9 shows the process flow of the fabrication of the FinFET device according to a further embodiment of the present invention.

FIG. 9 shows a process of fabricating of the FinFET device according to an embodiment present invention. The first step 905 is forming a SOI substrate. In step 910 etching the semiconductor layer to form fin structures and a semiconductor layer gap in between the fin structures and the BOX layer. Next, in step 915, depositing a sacrificial gate and offset spacers. Next, in step 920, the source and drain regions are implanted the ions. In step 925 removing the sacrificial gate. In step 930 removing the semiconductor layer gap in the gate region to prevent merging of the fin structures in the gate region. Next, in step 935, fabrication of a high-k dielectric metal gate in the gate region. Lastly, in step 940 performing silicidation in the S/D regions.

The methods as discussed above are used in the fabrication of integrated circuit chips. The resulting integrated circuit chips can be distributed by the fabricator in raw wafer form (that is, as a single wafer that has multiple unpackaged chip), as a bare chip, or in a packaged from. In the latter case, the chip is mounted in a single a chip package (such as a plastic carrier, with leads that are affixed to motherboard or other higher level carrier) or in a multi-chip pack age (such as a ceramic carrier that has either or both surface interconnection or buried interconnections). In any case, the chip is then integrated with other chips, discrete circuit elements, and/or other signal processing devices as part of either (a) an intermediate product, such as a motherboard, or (b) an end project. The end project can be any product that includes integrated circuit chips, ranging from toys and other low-end applications to advanced computer products (such as, but not limited to, an information processing system) having a display, a keyboard, or other input device, and a central processor.

As required, detailed embodiments of the present invention are disclosed herein, however, it is to be understood that the disclosed embodiments are merely exemplary of the present invention, which can be embodied in various forms.

Therefore, specific structural and functional details disclosed herein are not to be interpreted as limiting, but merely as a basis for the claims and as a representative basis for teaching on skilled in the art to variously imply the present invention in visually may appropriately detailed structure. Further, the terms and phrases used herein are not intended to be limiting but rather, to provide an understandable description of the present invention.

The terms "a" or "an" as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein are defined as comprising (i.e. open language). The term coupled, as used herein, is defined as connection, although not necessarily directly, and not necessarily mechanically. The terms program, software application, and the like as used herein, are defined as a sequence of instructions designed for execution on a computer system. A program, computer program, or software application can include a subroutine, a function, a procedure, an object method, an object implementation, an executable application, an applet, a server, a source code, an object code, a shared library/dynamic load library and/or other sequence of instruction designed for execution on a computer system.

Although specific embodiments of the invention have been disclosed, those having ordinary skill in the art will understand the changes can be made to the specific embodiments without departing from the spirit and scope of the invention. The scope of the invention is not restricted, therefore, to specific embodiments, and it is intended that the amended claims cover any and all such applications, modifications, and embodiments within the scope of the present invention.

What is claimed is:

1. A method for fabricating a FinFET device, the method comprising:
   forming a silicon-on-insulator (SOI) substrate having a semiconductor layer overlaying a buried oxide (BOX) layer;
   etching the semiconductor layer to form a plurality of fin structures and to form a semiconductor layer gap in between the fin structures and the BOX layer;
   depositing a sacrificial gate over at least one gate region, wherein the gate region separates a source and a drain region;
   disposing offset spacers on vertical sidewalls of the sacrificial gate;
   removing the sacrificial gate;
   removing the semiconductor layer gap in the gate region to prevent merging of the plurality of fin structures in the gate region; and
   fabricating a high-k dielectric metal gate structure overlaying the plurality of fin structures in the gate region.

2. The method according to claim 1, further comprising:
   performing ion implantation in the source and the drain regions to form a n-type or a p-type FinFET device.

3. The method according to claim 1, further comprising:
   etching the fin structures so that a width of the plurality of fin structures in the gate region is less than a width of the plurality of fin structures in the source and the drain regions.

4. The method according to claim 1, further comprising:
   forming high-k dielectric spacers on vertical sidewalls of the high-k dielectric metal gate structure and the plurality of fin structures.

5. The method according to claim 1, further comprising:
   forming a hardmask layer overlaying the semiconductor layer.

6. The method according to claim 1, further comprising:
   forming a metal silicide layer in the source and the drain regions.

7. The method according to claim 6, wherein the metal silicide layer includes tungsten.

8. The method according to claim 1, further comprising:
   planarizing the high-k dielectric metal gate structure using chemical mechanical polishing (CMP).

9. The method according to claim 1, wherein the thickness of the semiconductor layer gap is 10 nanometers.

10. The method according to claim 1, wherein the semiconductor layer material is silicon (Si).

11. The method according to claim 1, further comprising:
    etching the fin structures in the gate region so that a horizontal width of the plurality of fin structures ranges from about 1 nanometer to about 3 nanometers.

* * * * *